United States Patent
Imboden et al.

(10) Patent No.: US 11,669,051 B2
(45) Date of Patent: Jun. 6, 2023

(54) POWER INDICATOR DEVICE OF A THERMOELECTRIC GENERATOR OF A WATCH

(71) Applicant: The Swatch Group Research and Development Ltd, Marin (CH)

(72) Inventors: Matthias Imboden, St-Blaise (CH); Alain Jornod, Neuchatel (CH); Alexandre Haemmerli, Neuchatel (CH)

(73) Assignee: The Swatch Group Research and Development Ltd, Marin (CH)

( * ) Notice: Subject to any disclaimer, the term of this patent is extended or adjusted under 35 U.S.C. 154(b) by 37 days.

(21) Appl. No.: 17/203,178

(22) Filed: Mar. 16, 2021

(65) Prior Publication Data

US 2021/0341882 A1 Nov. 4, 2021

(30) Foreign Application Priority Data

Apr. 30, 2020 (EP) .................................... 20172418

(51) Int. Cl.
*G04C 10/04* (2006.01)
*H10N 10/17* (2023.01)
*H01L 35/32* (2006.01)

(52) U.S. Cl.
CPC .............. *G04C 10/04* (2013.01); *H01L 35/32* (2013.01)

(58) Field of Classification Search
CPC ................................ G04C 10/04; H01L 35/32
See application file for complete search history.

(56) References Cited

U.S. PATENT DOCUMENTS

2017/0235278 A1\* 8/2017 Vouillamoz ............ G04C 17/00
368/65

FOREIGN PATENT DOCUMENTS

| CH | 701 885 B1 | 3/2016 |
| EP | 1 939 700 B1 | 2/2010 |
| EP | 3 039 492 B1 | 7/2016 |

OTHER PUBLICATIONS

European Search Report for EP 20 17 2418 dated Oct. 13, 2020.

\* cited by examiner

*Primary Examiner* — Tamir Ayad
(74) *Attorney, Agent, or Firm* — Sughrue Mion, PLLC

(57) ABSTRACT

A power indicator device (1) of a thermoelectric generator of a watch. The indicator device includes a first gas fluid reservoir (2), a second gas fluid reservoir (3), and at least one tubular conduit (4) connecting the two reservoirs. The first reservoir is placed on an upper surface of the thermoelectric generator in a watch case, while the second reservoir (3) is placed on a lower surface of the thermoelectric generator in contact with the back of a watch case. The tubular conduit is of the capillary type and comprises in an intermediate portion (9) a liquid forming a barrier to the gas fluid of the two reservoirs and allowing, in a display portion (24) visible from the outside of the watch case, to provide an indication of the power of the generator by measuring the temperature difference of the two reservoirs.

19 Claims, 6 Drawing Sheets

POWER INDICATOR DEVICE OF A THERMOELECTRIC GENERATOR OF A WATCH

CROSS REFERENCE TO RELATED APPLICATIONS

This application is a Utility Application, claiming priority based on European Patent Application no. 20172418.4 filed Apr. 30, 2020.

TECHNICAL FIELD OF THE INVENTION

The invention relates to a device for indicating the power of a thermoelectric generator of a watch, in particular to indicate the provision of sufficient electrical power, when the watch is worn by a user. The indicator device is used to indicate the power of a thermoelectric generator by measuring the temperature difference between one end and the other end of the thermoelectric generator.

The invention also relates to a watch comprising a thermoelectric generator and at least one power indicator device of the thermoelectric generator.

PRIOR ART

The use of a thermometer or differential thermoscope to determine a temperature difference is well known. However, no analogue differential thermometer has yet been used to measure the power generated by a thermoelectric generator in a wearable object, such as a watch. In addition, it was never imagined to add such a differential thermometer to a watch, although an analogue thermometer in a watch may exist, but based on standard crystal thermometer technology. Such a thermometer is considered unnecessary since the temperature is dominated by the user's heating body, and thus the temperature vanes in an unpredictable way and also depending on changing environmental conditions.

Patent application WO 2012/162469 A2 describes a method for manufacturing a flexible composite panel, such as a product label. This panel has several reservoirs connected by at least one capillary tube, which has a shape with corrugations between a first reservoir and a second reservoir. The capillary tube is filled with a liquid that displaces according to the temperature difference between the first reservoir and the second reservoir. This type of composite panel is primarily used as a label to be placed on a product to show a temperature difference where said product is located. Such a flexible composite panel arrangement cannot be added to a wearable object, such as a watch, which is a disadvantage.

Patent CH 701 885 B1 describes a wristwatch, which comprises in a case closed by a crystal, a horological movement, and also a fluid pump driven by the movement in order to pump a fluid. A channel, made in the crystal, is provided to lead the fluid moved by the pump so as to display information, such as seconds or the pulse frequency. The channel may be of the small-dimension capillary tube type. It is not intended to use such a capillary tube to display information other than that relating to the time of day, which is a disadvantage.

Patent EP 1 939 700 B1 describes a device for displaying a dial indicator for a watch. The indicator may be in the shape of at least one hand to display information. The indicator hand(s) are hour and minute hands and can be controlled by control means to display specific information generally related to time. A method is also described for detecting whether the watch is worn on a person's wrist, for example by detecting the output power of an internal generator, which is a thermoelectric generator. However, nothing is described regarding a visual indicator in a shape other than one or more hands for displaying a temperature difference of a thermoelectric generator, in particular on a watch dial or on another location, which constitutes a disadvantage.

SUMMARY OF THE INVENTION

The purpose of the invention is therefore to overcome the disadvantages mentioned above with a power indicator device of a thermoelectric generator.

To this end, the invention relates to a power indicator device of a thermoelectric generator.

An advantage of the power indicator device of a thermoelectric generator is that the thermoelectric generator generates power in a few seconds when the watch is worn. Thus, a temperature difference from one side of the thermoelectric generator to the other can be measured easily and quickly. Thanks to a visual indicator preferably disposed at a watch dial, this allows to immediately see the power generated by the thermoelectric generator.

Advantageously, the indication of the temperature difference (thermal gradient) to determine the power generated by the thermoelectric generator is of the analogue type by the indicator device. As a result, it consumes less power than a digital indication on a conventional display device. The proposed indicator device uses a small fraction of the available power and consequently does not degrade the efficiency of the energy taken from or extracted from the thermoelectric generator.

Advantageously, even if the thermoelectric generator does not generate any power, the indicator device still operates and in this case indicates a temperature difference equal to 0 once calibrated. This is not possible for a system powered by electricity supplied by the thermoelectric generator. Thus, the indicator device is purely analogue and in addition, can be even more aesthetic than a digital display.

Advantageously, the indicator device can have a linear or non-linear display portion, for example by adapting the shape of the capillary tube containing a display oil. It can even be considered to have a logarithmic or hyperbolic portion of the display portion. This indicator device is therefore very simple with only a few parts and without having any external parts which move and which can wear out.

The simplicity of a differential thermometer is a strength. Compared to an electromechanical approach for measuring the current or voltage supplied by the TEG generator, such an indicator device is not affected by any magnetic field and is also more resistant to mechanical shocks.

To this end, the invention relates to a watch comprising a thermoelectric generator and at least one power indicator device of the thermoelectric generator.

BRIEF DESCRIPTION OF THE FIGURES

The purposes, advantages and features of the power indicator device of a thermoelectric generator will become more apparent in the following description on the basis of non-limiting embodiments illustrated by the drawings wherein.

DETAILED DESCRIPTION OF THE INVENTION

In the following description, a power indicator device of a thermoelectric generator is described, without going into too much detail of the manner of operation of said thermoelectric generator, which is well known in this technical field, and does not directly form part of the indicator device.

Figure 1:
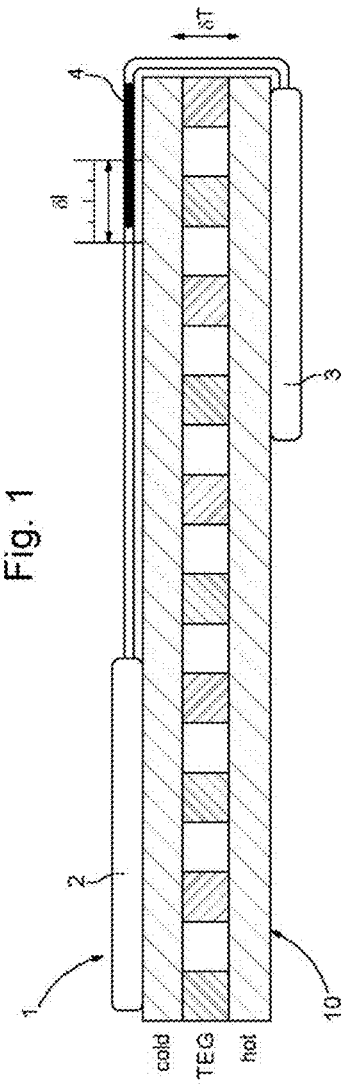
FIG. 1 shows a side view of an embodiment according to the invention of a power indicator device of a thermoelectric generator connected on one side and on the other side of the thermoelectric generator.

FIG. 1 shows a power indicator device 1 of a thermoelectric generator 10 preferably mounted in a watch. The indicator device 1 is connected for example to a bottom surface and a top surface of the thermoelectric generator 10 so as to perform a measurement of the temperature difference between these two surfaces, which determines the power of the generator. The bottom surface of the thermoelectric generator 10 is directly connected to a metal back of a watch case so as to contact the wrist of a watch user who is wearing it. In this way, the bottom surface of the thermoelectric generator is at a temperature close to that of the temperature of the user's wrist. On the other hand, the top surface is preferably well inside the watch case and therefore does not have the same temperature as the bottom surface. A temperature difference OT between these two surfaces can be measured by the indicator device 1 to indicate the power generated by the thermoelectric generator. This temperature difference 6T can be between 1 to 10° C., for example, but can also be greater depending on the temperature of the user's wrist and compared to the temperature inside the centre of the watch case.

Such a thermoelectric generator 10 usually generates power within seconds when the watch is worn. As the watch is typically running, there is obviously no indication of the operation of the thermoelectric generator. This is why provision is made of such an indicator device 1 according to the invention mounted in the watch to see outside the watch the power generated by the thermoelectric generator in an active mode.

The solution of the invention proposed with this indicator device 1 consists in defining that the power generated by the thermoelectric generator is proportional to the temperature difference between the upper surface and the lower surface of said thermoelectric generator. However, it is necessary to display the temperature differential to accurately display the instantaneous power generated. To this end, a differential thermometer is presented in the shape of the indicator device 1, which is designed to be adapted to the display of an existing thermal gradient in a watch once worn.

This indicator device 1 (differential thermometer) is based on a construction comprising two reservoirs 2, 3 filled with a fluid, which is preferably a gas fluid, the reservoirs 2, 3 being connected by a capillary-type tubular conduit 4, which contains a liquid, such as an oily liquid or alcohol, forming a barrier between the two reservoirs 2, 3. A first reservoir 2 can be placed on the upper surface of the thermoelectric generator 10, while a second reservoir 3 can be placed on the lower surface of the thermoelectric generator 10. As the gas fluid contained in the second reservoir 3 becomes hotter than the gas fluid contained in the first reservoir 2, when the watch is worn by a user, the oily liquid or alcohol in the tubular conduit 4 tends to displace in the direction of the first reservoir 2. Thus, the oily liquid or alcohol can move freely inside the tubular conduit 4 by changing the volume of gas fluid on one side or the other depending on the temperature difference. In a stable state, the two volumes of gas fluid may be identical, which means that the content of each reservoir may preferably be identical. The volume of gas fluid contained in the first reservoir 2 and up to the oily liquid or alcohol, as well as the volume of gas fluid contained in the second reservoir 3 and up to the oily liquid or alcohol can be identical at the same temperature. As the two reservoirs 2, 3 are rigid chambers, any change in the volume of gas fluid is only possible, if the liquid moves in the tubular conduit 4, which gives the desired indication of a thermal gradient.

The liquid used in the tubular conduit 4 has certain constraints. It must be incompressible, of low viscosity and of low vapour pressure. An additional constraint is that the liquid and the gas must be paired so that the gas cannot dissolve in the liquid. It is also clear that a dye is needed for the liquid to clearly distinguish it in the display portion 24. The dye should not coagulate or in any way precipitate with the liquid. If it has a low affinity to the capillary walls, it may be difficult to fill the tubular conduit 4 with the liquid. Otherwise, it may spread over the capillary walls inside the tubular conduit 4 and will not remain coherent. The liquid used can therefore be an alcohol, such as ethanol or methanol, or a substance, such as hydrocarbon or toluene. The liquid can also be an oily liquid. It is also possible to imagine introducing fluorescent or phosphorescent molecules into the liquid to allow the indication of the power of the thermoelectric generator to be viewed even at night.

An alternative is to have a specific layer deposited inside or more simply on the outside of the conduit, whose optical interaction with the liquid allows to see, via their specific refractive index, the exact position of the liquid. This type of optical combination is well known for other types of indicators, and are also applicable here.

The gas fluid used in the reservoirs 2, 3 may be a gas, such as nitrogen, carbon dioxide CO2, or argon, which is the more inert and probably the best noble gas. Helium can also be used, as it is good in terms of thermal conductivity and heat loads, but can be difficult to trap. Oxygen should be avoided, as it is very reactive. Obviously, it is better to have the same gas for both reservoirs 2, 3.

According to the arrangement of the two reservoirs 2, 3 on the thermoelectric generator 10 as shown in FIG. 1, the tubular conduit 4 may comprise flexible parts or portions between the first reservoir 2 and the second reservoir 3 to facilitate the mounting of the indicator device 1. The internal diameter of these flexible portions may be between 50 and 100 µm. Of course, only a simplified embodiment is shown in this FIG. 1, but other embodiments can indeed be considered. An intermediate portion of the tubular conduit 4, where the oily liquid or alcohol is partly located, allows to provide an indication of a thermal gradient on a graduated part 61, which can be inscribed for example on a dial of the watch. The internal diameter of this intermediate portion of the tubular conduit may be between 0.1 and 0.5 mm and depends on the liquid introduced into this intermediate portion so as to serve as a barrier to the gas fluid. Each graduation scale Ed can for example be defined at 2.6 mm/° C., but many other graduations can also be applied to display this thermal gradient.

The two parallelepiped-shaped reservoirs 2, 3, which are shown here, may have a volume for the gas fluid, for example of the order of 10 to 100 mm³. The tubular conduit 4 connecting the two reservoirs may have a negligible volume in comparison, and the thermal gradients of the tubular conduit 4 can be neglected. The internal diameter of the tubular conduit 4 is critical, which can be the basis for the volumetric change. The internal diameter of the tubular conduit 4 (ID) is also large, since it defines the visual part of the indicator device 1 visible from the outside of the watch.

According to a first linear approximation, for example the change in the given volume of the two reservoirs 2, 3 can be expressed by a change in temperature as:

$$\delta V(\delta T) = \frac{V_0}{2T_0} \delta T$$

where $V_0$ is the volume (identical for the two reservoirs in this case) at the temperature $T_0$. Due to a temperature difference $\delta T$ between the hot and cold reservoirs 2, 3, the position of the coloured oil drop is thus given as:

$$\delta l(\delta T) = \frac{\delta V}{\pi \left(\frac{ID}{2}\right)^2} = \frac{V_0}{2\pi \left(\frac{ID}{2}\right)^2} \frac{\delta T}{T_0}$$

In the case of a modest volume of 49 mm³ for each reservoir 2, 3, and a capillary-type tubular conduit 4 with an internal diameter of 0.2 mm, it is to be expected that the indicator element (oily liquid or alcohol) can be displayed with a graduation of 2.6 mm/° C. In addition, during the stable state operation of the thermoelectric generator watch, $\delta T$ may be, for example, between 1 to 10° C. When the watch is placed on a user's wrist, the second reservoir 3 on the side of the back of the watch case is at the skin contact. There is thus a sudden change in temperature, the thermal gradient of which can reach 10° C.

Figure 2C:
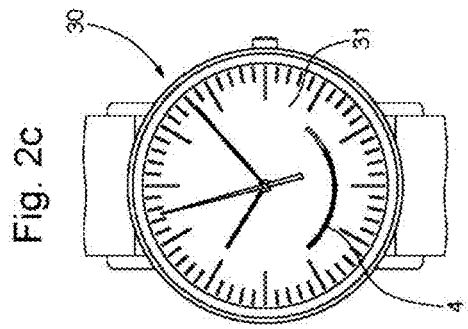
FIGS. 2a, 2b and 2c show a top view of a watch which comprises the power indicator device of the thermoelectric generator seen on a watch dial according to the invention.
Figure 2B:
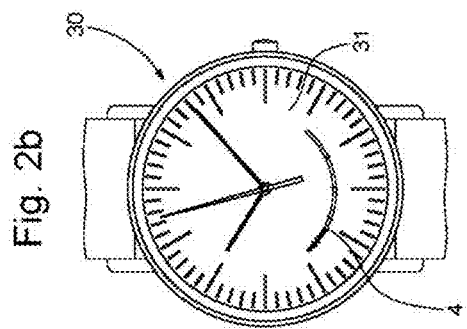
Figure 2A:
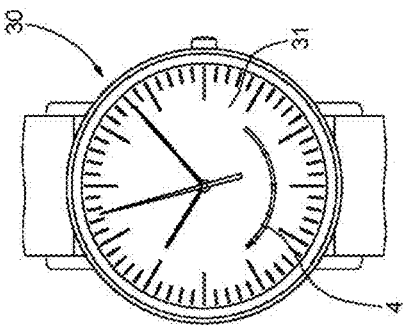

FIGS. 2a, 2b and 2c show a top front view of a watch 30, which comprises the power indicator device of the thermoelectric generator. A display portion of the tubular conduit 4, which comprises the oily liquid or preferably coloured alcohol, is visible on the dial 31 of the watch 30. This display portion defines a circular part centred on the central axis of the watch 30. The display portion can be disposed on the watch 30 dial 31 or below said dial while being visible through a through-window of the watch 30 dial 31. A graduation is made on the dial 31 near the display portion of the tubular conduit 4.

In FIG. 2a, it can be noted that the oily liquid or coloured alcohol coming from the left stops at an initial position 0 of a graduation, which can be defined in nW or in OT in this case. This means that the two reservoirs with their gas fluid are either at the same temperature or that the watch 30 is left at rest without being worn on a user's wrist.

In FIG. 2b, it can be noted that the oily liquid or alcohol has moved to the right slightly to a position indicating, for example, 2 $\delta T$. This means that watch 30 is in a stable condition, that is to say, the watch 30 has been worn on a user's wrist for some time.

In FIG. 2c, it can be noted that the oily liquid or coloured alcohol has moved strongly to the right to a position indicating for example 16 $\delta T$. This means that the watch 30 has just been put around a user's wrist. The second reservoir heats up faster than the first reservoir in the watch case 30. Thus, there is an abrupt change in temperature at the second reservoir, which leads to a higher power than it should be at the stable state.

Figure 3:
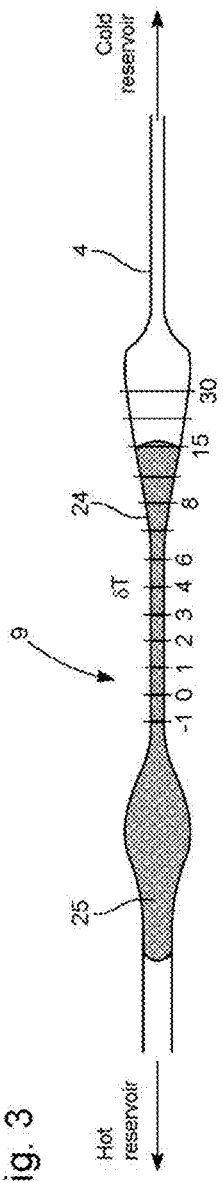
FIG. 3 shows a view of an embodiment of the display portion between two air reservoirs of the indicator device with a tubular conduit of the capillary type containing a coloured liquid and which has a particular shape with an indication over its length which is on the one hand linear and on the other hand non-linear of the temperature difference according to the invention.

FIG. 3 shows a view of an embodiment of an intermediate portion 9 of the tubular conduit 4, which comprises a display portion 24 between two reservoirs of gas fluid, such as air, of the indicator device. The hot reservoir is on the left side of the intermediate portion 9, while the cold reservoir is on the right side of the intermediate portion 9. The tubular-shaped intermediate portion 9 extends in a rectilinear direction from its inlet in the direction of the hot reservoir, to its outlet in the direction of the cold reservoir. At the intermediate portion 9 of the tubular conduit 4, it can be noted that the particular shape of the tubular conduit 4, which varies from the left part to the visible right part. Preferably, this intermediate portion 9 of the tubular conduit 4 can be made of a material, such as glass or sapphire, which is transparent to see the liquid, for example coloured from the outside of the watch.

The material of the intermediate portion 9 must be selected depending on the liquid introduced into the capillary-type tubular conduit 4. The inner surface of the glass or sapphire can be adapted to the liquid introduced into the intermediate portion 9. However, it is advantageous not to require any particular surface treatment in this intermediate portion 9, since this becomes difficult to be controlled in its small geometric ratios and can be degraded over time. Instead of glass or sapphire, various polymers, thermoplastics, elastomers, hydrogels, or else silicon, which can be worked, can be selected as the material of the intermediate portion 9.

This intermediate portion 9 contains an oily liquid or coloured alcohol and has a particular shape with an indication of graduation along the length of the display portion 24 which is on the one hand linear and on the other hand non-linear for the temperature difference. This graduation is preferably applied to the watch dial. The intermediate portion 9 comprises in connection with the display portion 24 on the side of the hot reservoir, a liquid reservoir 25 in the shape of a large drop. In the liquid reservoir 25, sufficient liquid is provided to ensure a filled volume for the display of the power indication in the display portion 24 of the indicator device.

The second reservoir of the indicator device is the hot reservoir, while the first reservoir of the indicator device is the cold reservoir. Depending on the temperature difference between the two reservoirs, the volume of gas fluid on the hot reservoir side is greater than the volume of gas fluid on the cold reservoir side. Thus, the oily liquid or alcohol is shown, which has displaced on the graduation 15 or 16, which can be expressed in 6T, as shown in FIG. 2*c* above. From indication 6, which can be expressed in 6T, the internal diameter of the tubular conduit 4 can increase linearly in the direction of the cold reservoir. This allows to have a display portion 24 that is shorter depending on the thermal gradient measured.

It should be noted that a constant internal diameter ID of the tubular conduit 4 results in a linear scale, since the volume variation depends linearly on the position of the liquid since $\delta V = \pi \cdot (ID/2)^2 \cdot \delta I$. Any other scale, including parabolic or logarithmic scale, can be constructed by varying the internal diameter ID depending on the position along the scale. For example, a logarithmic scale is obtained by scaling the internal diameter ID so that $\delta V \sim \log(\delta I)$. The internal diameter of the tubular conduit 4 can vary at a pre-selected rate from the resulting distance on a linear, logarithmic or hyperbolic scale as desired.

Figure 4:
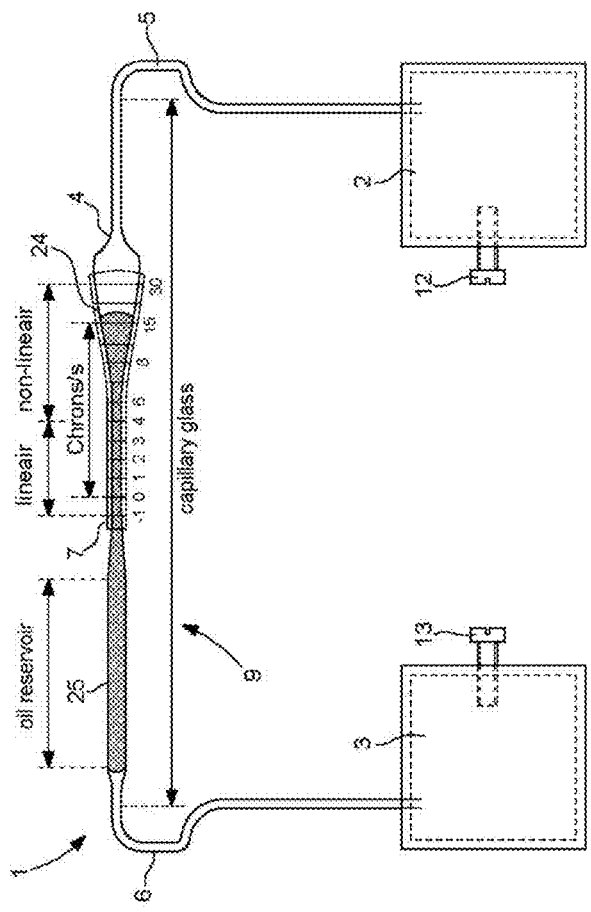
FIG. 4 shows a general view of one embodiment of the entire indicator device and which comprises a display portion as shown in FIG. 3 above.

FIG. 4 schematically shows all the elements of the indicator device 1. In this FIG. 4, there is an intermediate portion 9 of the capillary-type tubular conduit 4, substantially similar to that shown in FIG. 3 described above. The liquid reservoir 25, which may be oil, is in a cylindrical shape with an internal diameter larger than the internal diameter of the cylindrically-shaped linear part of the display portion 24. This allows to ensure a volume filled with oil for displaying the power indication in the display portion 24.

According to a variant embodiment shown in this FIG. 4, this display portion 24 can be visible through a window 7 made in the watch dial, given that all the elements of the indicator device are located below the watch dial. However, it can be imagined that the display portion 24 is disposed on the watch dial, and in this case, no window 7 is made in the dial, but only two holes for the passage of the display portion 24.

The intermediate portion 9 is preferably made of glass or sapphire. At the outlet of the display portion 24, a first flexible tubular portion 5 of the tubular conduit 4 connects the display portion 24 to the first gas fluid reservoir 2. Likewise, at the outlet of the liquid reservoir 25, which is the inlet of the intermediate portion 9, a second flexible tubular portion 6 of the tubular conduit 4 connects the liquid reservoir 25 to the second gas fluid reservoir 3. The two flexible tubular portions 5, 6 and the intermediate portion 9 together form the capillary-type tubular conduit 4. The internal diameter of these flexible portions 5, 6 may even be smaller than the internal diameter of the linear part of the display portion 24. Of course, as not precisely shown in FIG. 4, the first reservoir 2 is mounted on an upper surface of the thermoelectric generator, while the second reservoir 3 is mounted on a lower surface of the thermoelectric generator on the side of the back of the watch case as shown in FIG. 1.

It should also be noted that the first reservoir 2 further comprises a screw 12 as a means for adjusting the volume of the gas fluid inside the first reservoir 2. The second reservoir 3 also comprises a screw 13 as a means for adjusting the volume of the gas fluid inside the second reservoir 3, as will be explained in more detail in FIG. 6 below.

It should be noted that if units, which are not particularly natural, such as [nW] and [δT], are taken, there is no intuitive translation into a useful measure. It can therefore be proposed to define the unit "Chron", which represents the unit of energy necessary for the Lavet motor to move forward one step. In the case of a watch with a second hand, the energy consumption is 1 Chron/s. This can therefore be indicated on the scale as a replacement for the unit nW or δT. Thus, when the indicator is at "1 Chron/s", there is as much energy generated by the TEG generator as that consumed by the Lavet motor to keep the watch running. For a typical user, the stable state may be at "3 Chrons/s": 1 Chron/s is used to keep the watch running, the remaining 2 Chrons/s are stored in the battery for later use.

In the case of the effect of gravity, the pressure exerted by the liquid in the tubular conduit 4, there is $\delta P = \rho \cdot g \cdot h$, where h is the length of the drop of liquid with density ρ. This is compensated for by a change in the volume $\delta V = \delta I \cdot \pi \cdot (ID/2)^2$. Given that $2 \cdot \delta V = \delta P \cdot (V/P)$, it is found that $\delta I = (2 \cdot V/(\pi \cdot P \cdot ID^2)) \cdot \rho \cdot g \cdot h = 75$ μm per mm of liquid. However, a variation of the order of 1 mm in the positioning of the drop can be imagined when the watch is turned over. But given what is typical, the watch will be looked at when it is in a horizontal plane, a design of the path can be made, such as the height in the expression above is minimised typically by about a few millimetres, then the variation in the positioning of the drop, if the watch is turned over, remains less than 300 μm.

According to a thermal course, the thermal resistance of the capillary glass can be compared to the thermal resistance of the thermoelectric generator. This gives the ratio of lost heat flux to the indicator device 1 compared to the thermoelectric generator 10, which generates the necessary energy.

At the display portion 24, the capillary glass may have an external diameter of 1 mm, of a length $L_c$ equal to 10 mm and a thermal conductivity λ=1 W/(m·K), which has a thermal resistance $R_{cap} = (4 \cdot L_c)/(\lambda \cdot \pi \cdot OD^2) = 12'700$ KM/placed in parallel with the thermoelectric generator of the thermal resistance $R_{teg}$.

The equivalent thermal resistance of $R_{cap}$ and $R_{teg}$ in parallel is $R_{par} = R_{cap} \cdot R_{ted}(R_{cap} + R_{teg})$. For a TEG generator 10 adapted to the watch, the thermal resistance $R_{teg}$=100 KM leading to $R_{par} = R_{cap} \cdot R_{teg}/(R_{cap} + R_{teg}) = 99.2$ K/W and the thermal loss is thus typically lower than 1% and not measurable in the proposed system.

Figure 5:
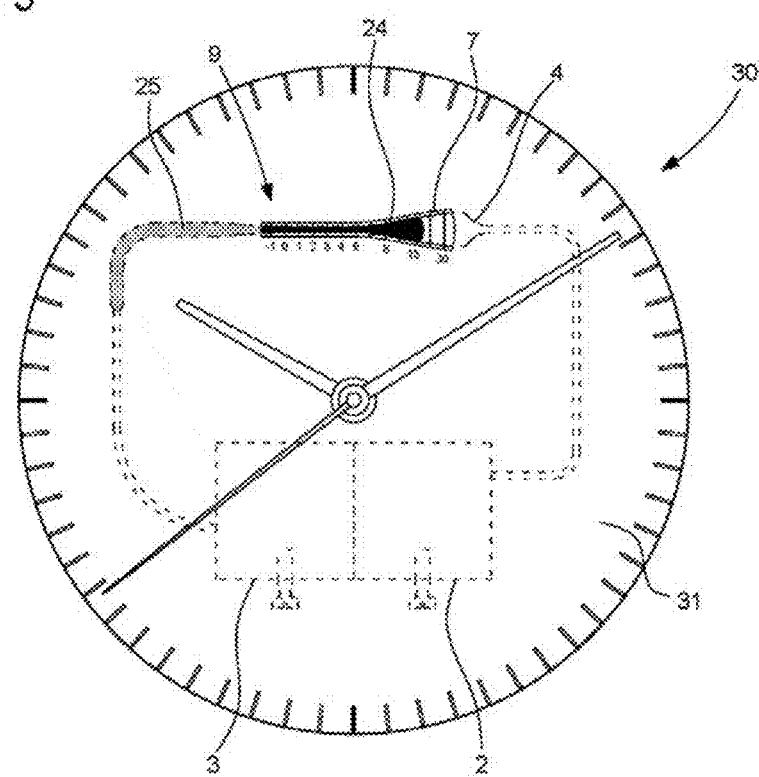
FIG. 5 shows a top view of the watch at the dial through which a window is made on the display portion of the indicator device according to the invention to show the power generated by the thermoelectric generator.

FIG. 5 shows a top view of the watch 30 at the dial 31 through which a window 7 is made on the display portion 24 of the indicator device. This display portion 24 allows to show the power generated by the thermoelectric generator following a temperature difference between the first reservoir 2 and the second reservoir 3. The intermediate portion 9 further comprises an oil reservoir 25, which is under the dial 31 between the display portion 24 and the second reservoir 3. Of course, as indicated above, the first reservoir 2 may not be in the same plane as the second reservoir 3 in the watch case 30.

Figure 6:
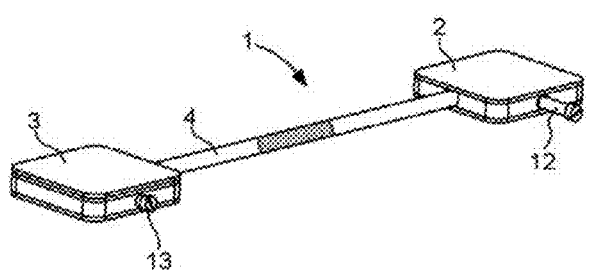
FIG. 6 shows a schematic three-dimensional view of a first embodiment of the indicator device according to the invention having two gas fluid reservoirs connected by a capillary-type tubular conduit, and having means for calibrating the indication displayed by the liquid in the capillary-type tubular conduit in the initial state.

FIG. 6 shows a simplified three-dimensional view of a first embodiment of the indicator device 1 according to the invention having two gas fluid reservoirs 2, 3 connected by a capillary-type tubular conduit 4. The oily liquid or alcohol can be seen, which is in the intermediate portion of the tubular conduit 4. This first embodiment has already been described above with reference to FIG. 4. Means for adjusting the volume of the gas fluid in the reservoirs 2, 3 are provided to calibrate the indication displayed by the liquid in the intermediate portion of the tubular conduit 4. Preferably, the two reservoirs 2, 3 are of identical shape and content, which means that in the initial state, the liquid in the intermediate portion must be in a central position of the tubular conduit 4. For this purpose, the first reservoir 2 comprises a first adjustment screw 12, while the second reservoir 3 comprises a second adjustment screw 13. By screwing or unscrewing at least one of the screws 12, 13 towards the inside or the outside of the chamber of the reservoirs 2, 3, the volume of gas fluid is adjusted to carry out a calibration of the position of the liquid in the tubular conduit 4, when the temperature in the two reservoirs 2, 3 is the same, or the temperature difference is known.

Figure 7:
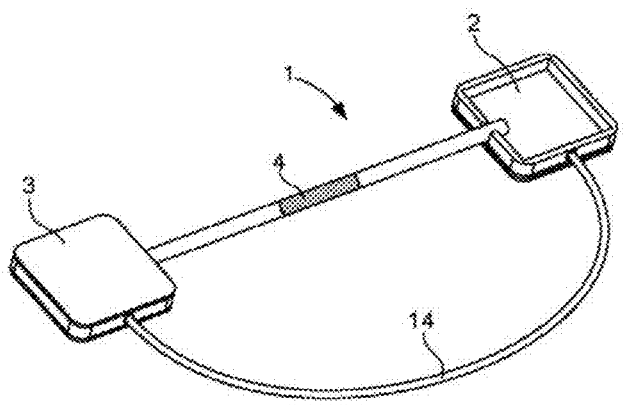
FIG. 7 shows a schematic three-dimensional view of a second embodiment of the indicator device according to the invention having two gas fluid reservoirs connected by a capillary-type tubular conduit, and having means for calibrating the indication displayed by the liquid in the capillary-type tubular conduit in the initial state.

FIG. 7 shows a simplified three-dimensional view of a second embodiment of the indicator device 1 according to the invention having two gas fluid reservoirs 2, 3 connected by a capillary-type tubular conduit 4, wherein the oily liquid or alcohol which is in the intermediate portion of the tubular conduit 4 can be observed. This part of this second embodiment is identical to the first embodiment described above with reference to FIG. 6. On the other hand, other means for adjusting the volume of gas fluid in the reservoirs 2, 3 are provided to calibrate the indication displayed by the liquid in the intermediate portion of the tubular conduit 4. As previously, the two reservoirs 2, 3 are of identical shape and content, which means that in the initial state, the liquid in the intermediate portion must be in a central position of the tubular conduit 4.

The adjustment means are formed in this second embodiment by a tubular branch 14, which may be partly flexible over its length, and which connects the chamber of the first reservoir 2 to the chamber of the second reservoir 3. As shown in FIG. 7, a cover for closing the chamber of the first reservoir 2 has been removed so as to show the shape of the inner chamber. If a chamber of a reservoir is heated during assembly with the liquid displacing through the intermediate portion of the tubular conduit 4, the position of the liquid can be adjusted using the tubular branch 14, even when the reservoir is closed. The idea is that the tubular branch 14 can be crushed, which can isolate both sides. Then, by selectively crushing the tubular branch 14, the gas fluid can be pushed into one and/or the other chamber and displace the indicator liquid precisely, much like in a peristaltic pump. This therefore allows to finely adjust the volume of fluid in each chamber and thereby precisely position the indicator liquid. Thus, an operation of calibrating the position of the liquid in the tubular conduit 4 can be carried out initially. This operation is not too difficult to perform, since the gas fluid, such as air, in the two chambers of the reservoirs 2, 3 can be at atmospheric pressure. The tubular branch 14 can optionally be removed after calibration by plugging the connection holes to the chambers of the reservoirs 2, 3.

Figure 8:
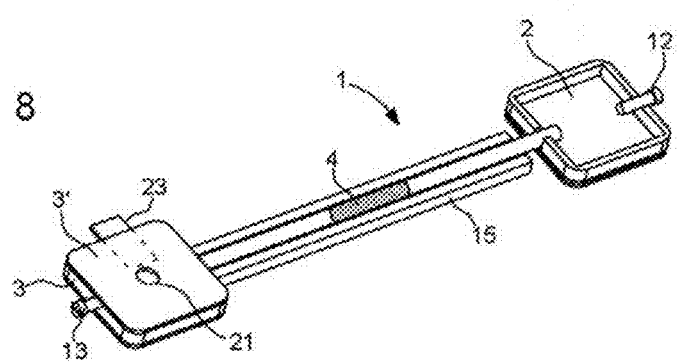
FIG. 8 shows a schematic three-dimensional view of a variant embodiment of the indicator device according to the invention shown in FIGS. 6 and 7, FIGS. 9a, 9b, 9c show a side view and two top views of a microfluidic chamber, which comprises the display portion of the indicator device according to the invention.

FIG. 8 shows a variant embodiment of FIGS. 6 and 7, wherein provision is also made below the transparent capillary-type tubular conduit 4, of a mirror 15 having a semi-cylindrical longitudinal groove of a shape complementary to the tubular conduit 4. This tubular conduit 4 is disposed in the longitudinal groove of the mirror 15, so as to improve the visibility of the liquid in the display portion of the indicator device to indicate the temperature difference and therefore the power generated by the thermoelectric generator.

The indicator device of FIG. 8 also has as adjustment means a through opening 21, which is made in the cover or lid 3' of the second reservoir 3 so as to supply a gas fluid through this opening 21 for adjusting the position of the liquid in the intermediate portion of the tubular conduit 4. Provision is also made of a closing plate 23 which can slide in the cover 3' of the second reservoir 3 to close the through opening 21 once the position of the liquid is well defined in the intermediate portion. The same is true for the first reservoir, where provision may be made of a through opening, not shown, which is made in the cover, which closes the chamber of the first reservoir. A closing plate is also provided in the cover of the first reservoir to close the through opening of this cover once the position of the liquid is well defined in the intermediate portion.

It should be noted that other means for closing the through openings made in the covers of the reservoirs 2, 3 can be provided. Use can be made of a plug on each opening, or a closing disc which is rotatably mounted at the corresponding through opening, or the like.

Once the calibration operations have been completed, provision may also be made of an adjustment screw 12 for the first reservoir 2 and an adjustment screw 13 for the second reservoir 3. As these adjustment screws have already been discussed with reference to FIG. 6, the detailed description will not be repeated. These adjustment screws 12, 13 can also be used after closing the covers of each reservoir 2, 3, if a pressure difference is observed with the liquid, which has slightly moved from its defined position.

It can also be imagined to have above the display portion on the dial, a magnifying glass which is not shown to increase the visibility and readability of the power indication of the thermoelectric generator shown in the display portion.

Figure 9A:
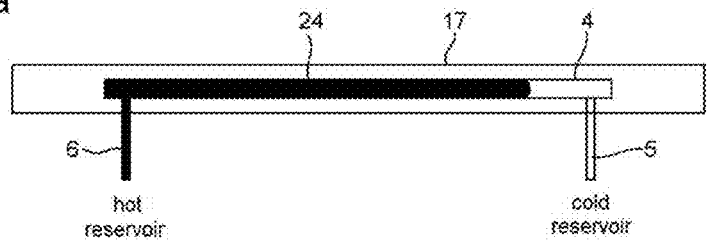
Figure 9B:
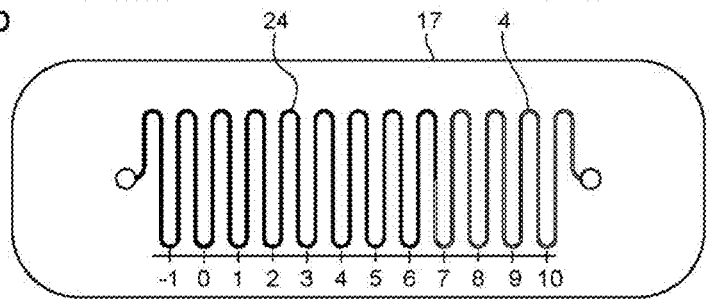
Figure 9C:
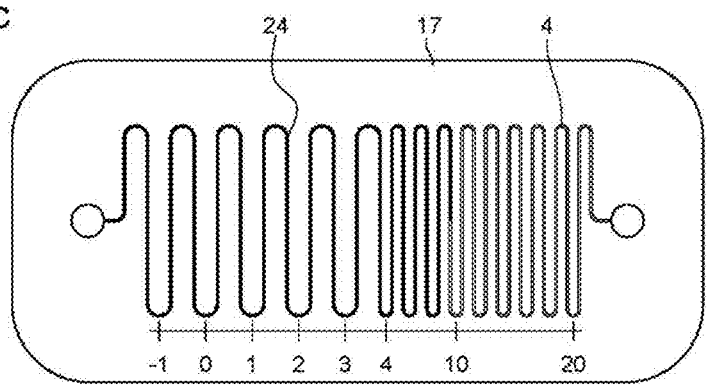
Figure 11:
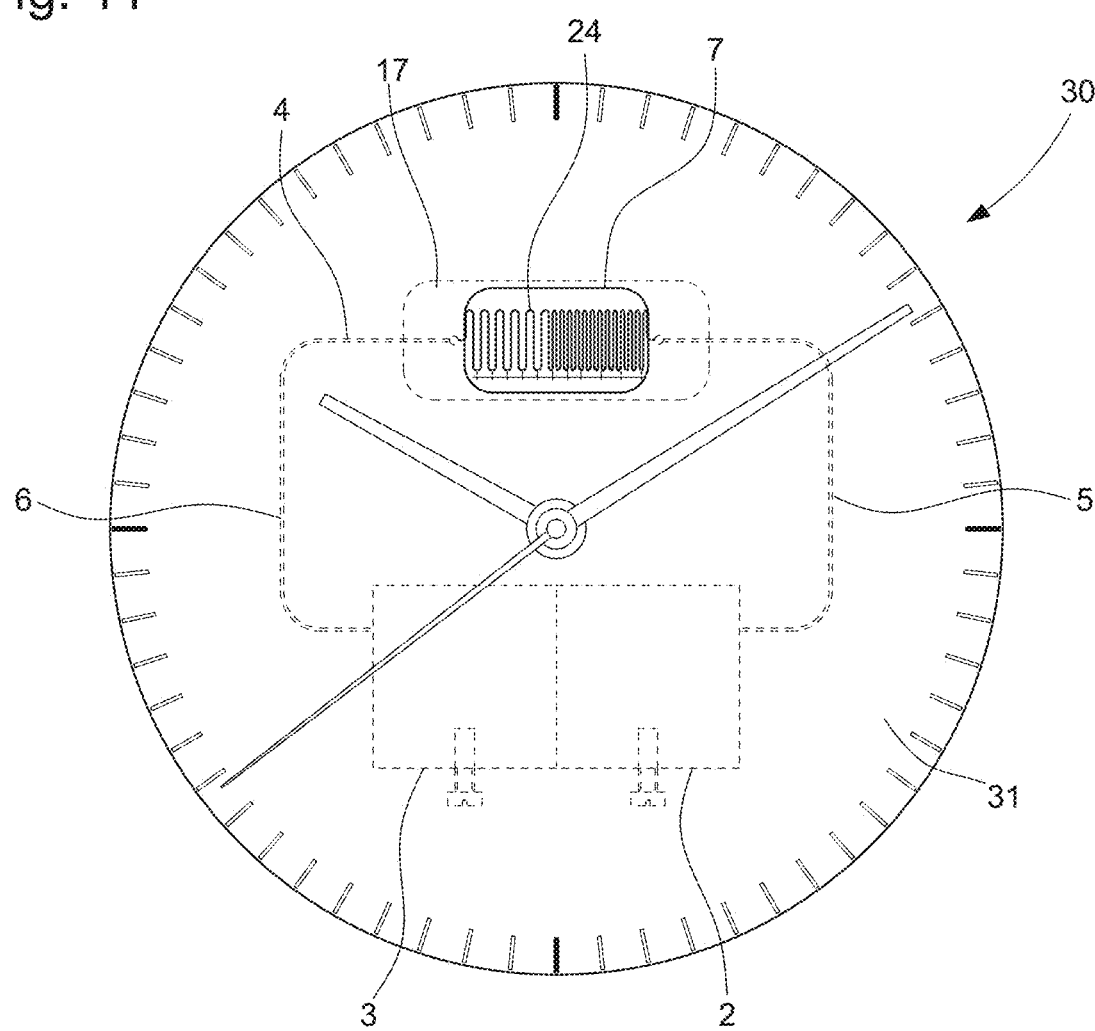
FIG. 11 shows a top view of the watch at the dial through which a window is made on the display portion of the indicator device according to the invention with the microfluidic chamber shown in FIGS. 9a, 9b and 9c.

FIGS. 9a, 9b and 9c show a side view and two top views of the display portion 24 of the indicator device. This display portion 24 can be shown through a window made in the watch dial to be visible on the outside of the watch case, as shown in FIG. 11 below. This window of FIG. 11 can be limited from the input to the output of the display portion, which is not shown in these FIGS. 9a, 9b and 9c. The tubular conduit 4, which can be considered to be of the capillary type, is made entirely in a microfluidic chamber 17 having the display portion 24. This replaces the display portion of the tubular conduit described above, which was mainly a capillary glass or sapphire. This tubular conduit 4 can be produced on a transparent substrate by any etching or machining method similar to an integrated circuit on silicon. And once the shape of the tubular conduit 4 has been produced on the first transparent substrate, a second transparent substrate is fixed on the first transparent substrate to completely close the microfluidic chamber 17, which thus comprises, integrated, the tubular conduit 4.

In FIG. 9a, the indicator device comprises a first flexible tubular portion 5 connected to the first cold reservoir, and to an outlet of the microfluidic chamber 17, and a second flexible tubular portion 6 connected to the second hot reservoir, and to an inlet of the microfluidic chamber 17. Part of the oily liquid or alcohol is also in the second flexible tubular portion 6, the internal diameter of which is larger than the diameter of a tubular conduit 4 integrated in the microfluidic chamber 17. From the inlet to the outlet of this microfluidic chamber 17, this tubular conduit 4 defines corrugations in the shape of a coil. Under these conditions, little liquid needs to be pushed from the second flexible tubular portion 6 into the tubular conduit 4 of the microfluidic chamber 17.

This microfluidic chamber 17 therefore comprises in the display portion 24, a tubular conduit 4 in the shape of a coil and with a spacing identical to FIG. 9b from the inlet to the outlet of the display portion 24, with a constant graduation over the entire display portion. On the other hand, in FIG. 9c, the microfluidic chamber 17 comprises a first tubular conduit in the shape of a coil and of identical spacing, followed by a second tubular conduit in the shape of a coil, but with a smaller spacing between each corrugation than the first conduit. In this way, a different graduation in steps of greater value can be defined on this second tubular conduit to the outlet in the direction of the cold reservoir.

Figure 10:
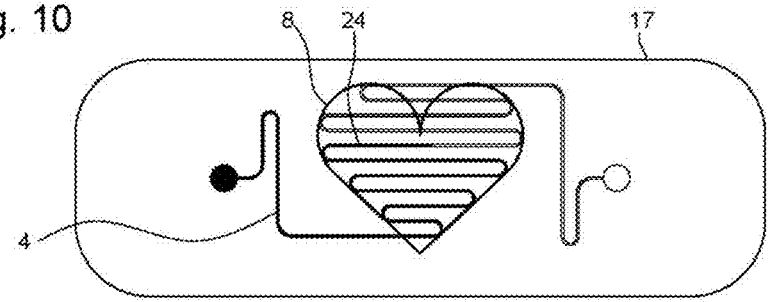
FIG. 10 shows a variant of the embodiments presented in FIGS. 9a, 9b and 9c.

FIG. 10 shows a variant embodiment of the microfluidic chamber 17 comprising the display portion 24. The tubular conduit 4 in this display portion 24 defines several corrugations in the shape of a coil, delimited in a heart 8 shape to provide a different visual appearance. Other shapes than just a heart can be provided for the arrangement of the tubular conduit 4 in the microfluidic chamber 17.

FIG. 11 shows a top view of the watch 30 at the dial 31 through which a window 7 is made on the display portion 24 of the microfluidic chamber 17 as shown in FIG. 9b described above, of the indicator device. This display portion 24 allows to show the power generated by the thermoelectric generator following a temperature difference between the first reservoir 2 and the second reservoir 3. Of course, as indicated above, the first reservoir 2 may not be in the same plane as the second reservoir 3 in the watch case 30.

It should be noted that the microfluidic chamber 17 can also be fixed in the window 7 of equivalent dimension or on the dial 31 of the watch 30. In this case, the inlet of the microfluidic chamber 17 is connected through the dial 31 to the second flexible tubular portion 6 in the direction of the second reservoir 3, while the outlet of the microfluidic chamber 17 is connected through the dial 31 to the first flexible tubular portion 5 in the direction of the first reservoir 2.

From the description which has just been given, several variant embodiments of the power indicator device of a thermoelectric generator are possible without departing from the scope of the invention defined by the following claims. It may be provided to have a first reservoir of double size or half the size of the second reservoir. The display portion can be made of several tubular conduit parts of different internal diameter. The display portion can also be disposed on the dial of a watch.

The invention claimed is:

1. A power indicator device (1) of a thermoelectric generator (10) of a watch (30), the indicator device (1) comprising a first gas fluid reservoir (2), a second gas fluid reservoir (3), and a tubular conduit (4) connecting the two reservoirs (2, 3), the first reservoir (2) being intended to be placed on an upper surface of the thermoelectric generator (10) in a watch case (30), while the second reservoir (3) is intended to be placed on a lower surface of the thermoelectric generator (10) in contact with the back of the watch case (30), the first and second gas fluid reservoir each having a gas fluid therein,
wherein the tubular conduit (4) is of the capillary type and comprises in an intermediate portion (9) a liquid forming a barrier to the gas fluid of the two reservoirs (2, 3) and allowing in a display portion (24) in the intermediate portion (9), to provide an indication of the power of the generator by measuring the temperature difference of the two reservoirs (2, 3), the display portion (24) being intended to be disposed in the watch case (30) to be visible from the outside of the watch case (30) with the liquid being at least partially visible in the display portion,
wherein the intermediate portion (9) of the tubular conduit (4) is a capillary glass or a sapphire, and
wherein the intermediate portion (9) comprises the display portion (24) on one side in the direction of the first reservoir (2), and a liquid reservoir (25) on one side in the direction of the second reservoir (3), the liquid reservoir (25) at an inlet of the intermediate portion (9) being directly connected to the display portion (24) at an outlet of the intermediate portion (9) to form the capillary glass or sapphire in one piece.

2. The indicator device (1) according to claim 1, wherein the liquid partially visible in the display portion (24) for indicating the power of the thermoelectric generator (10), is an oily liquid or colored alcohol, and wherein the display portion (24) is adapted to be disposed on a dial (31) of the watch (30), or under the dial (31) of the watch (30) and visible through a through-window (7) of the dial (31) of the watch (30).

3. The indicator device (1) according to claim 1, wherein a first end of the intermediate portion (9) is connected by a first flexible tubular portion (5) to the first reservoir (2), and wherein a second end of the intermediate portion (9) is connected by a second flexible tubular portion (6) to the second reservoir (3).

4. The indicator device (1) according to claim 1, wherein the liquid reservoir (25) at the inlet of the intermediate portion (9) is connected to the display portion (24) at the outlet of the intermediate portion (9) to form the capillary glass or sapphire in one piece in a rectilinear direction from the inlet to the outlet of the intermediate portion (9).

5. The indicator device (1) according to claim 1, wherein the liquid reservoir (25) has therein sufficient liquid to ensure a filled volume for the display of the power indication in the display portion (24).

6. The indicator device (1) according to claim 1, wherein the liquid reservoir (25) is in a cylindrical shape having an internal diameter larger than the internal diameter at the input of the display portion (24) to comprise sufficient liquid to ensure a filled volume for the display of the power indication in the display portion (24).

7. The indicator device (1) according to claim 5, wherein the display portion (24) comprises at the input a first linear part of cylindrical shape followed by a second non-linear part, the internal diameter of which increases to the output of the display portion in the direction of the first reservoir (2).

8. The indicator device (1) according to claim 7, wherein the second non-linear part of the display portion (24) increases linearly from the first linear part at the output of the display portion (24).

9. The indicator device (1) according to claim 1, wherein a part of the tubular conduit (4) is integrated in a microfluidic chamber (17), which comprises the display portion (24) in the intermediate portion (9), wherein the indicator device (1) comprises a first flexible tubular portion (5) connected to the first reservoir (2) and to an outlet of the microfluidic chamber (17), and wherein the indicator device (1) comprises a second flexible tubular portion (6) connected to the second reservoir (3) and to an inlet of the microfluidic chamber (17).

10. The indicator device (1) according to claim 9, wherein the microfluidic chamber (17) comprises a tubular conduit made with corrugations in the shape of a coil from the inlet to the outlet of the microfluidic chamber (17).

11. The indicator device (1) according to claim 10, wherein the tubular conduit in the microfluidic chamber (17) consists of a first conduit with corrugations in the shape of a coil, and identical spacing, followed by a second conduit with corrugations in the shape of a coil, but with a smaller spacing between each corrugation than the first conduit so as to define a different graduation in steps of greater value on this second conduit to the outlet in the direction of the first reservoir (2).

12. The indicator device (1) according to claim 9, wherein the second flexible tubular portion (6) comprises part of the liquid, which is an oily liquid or alcohol, to serve as a liquid reservoir, the internal diameter of the second flexible tubular portion (6) at the inlet of the microfluidic chamber (17), being larger than the diameter of the tubular conduit in the microfluidic chamber (17).

13. The indicator device (1) according to claim 1, further comprising means for adjusting the volume of the gas fluid in the reservoirs (2, 3) to initially calibrate the indication displayed by the liquid in the display portion (24) of the intermediate portion (9) of the tubular conduit (4), wherein the adjustment means are constituted by a first adjustment screw (12) screwed into the first reservoir (2), and by a second adjustment screw (13) screwed into the second reservoir (3), by screwing or unscrewing at least one of the screws (12, 13) towards the inside or outside of a chamber of the reservoirs (2, 3), the volume of gas fluid can be adjusted to calibrate the initial position of the liquid in the display portion (24).

14. The indicator device (1) according to claim 1, further comprising adjustment means constituted by a tubular branch (14) connecting a chamber of the first reservoir (2) to a chamber of the second reservoir (3) for adjusting the volume of gas fluid in the two reservoirs (2, 3) to calibrate the initial position of the liquid in the display portion (24).

15. The indicator device (1) according to claim 1, further comprising adjustment means constituted by a through opening (21), which is formed in a cover or lid (3') of the second reservoir (3) to supply a gas fluid through this opening (21) for adjusting the position of the liquid in the intermediate portion (9) of the tubular conduit (4), and through a through opening made in a cover or lid of the first reservoir (2) to supply a gas fluid through this opening of the first reservoir (2) for adjusting the position of the liquid in the intermediate portion (9) of the tubular conduit (4), wherein the openings of the covers or lids of the first and second reservoirs are closed by a closing plate (23) after calibration, and wherein the adjustment means are further constituted by a first adjustment screw (12) screwed into the first reservoir (2), and by a second adjustment screw (13) screwed into the second reservoir (3), by screwing or unscrewing at least one of the screws (12, 13) towards the inside or outside of a chamber of the reservoirs (2, 3), the volume of gas fluid can be adjusted to calibrate the initial position of the liquid in the display portion (24).

16. The indicator device (1) according to claim 13, further comprising a mirror (15) disposed under the display portion (24) to improve the visibility of the liquid in the display portion (24).

17. A watch (30) comprising the thermoelectric generator (10) and at least one power indicator device (1) of the thermoelectric generator (10) according to claim 1.

18. The watch (30) according to claim 17, further comprising a dial (31), and wherein the display portion (24) of the indicator device (1) is disposed on the dial (31) or under the dial (31) to be visible outside the watch case, through a through-window (7) of the dial (31).

19. The watch (30) according to claim 17, further comprising the first reservoir (2) disposed on an upper surface of the thermoelectric generator (10), and the second reservoir (3) disposed on a lower surface of the thermoelectric generator (10) in direct contact with the back of the watch case (30), the first reservoir (2) being connected to the second reservoir (3) by the tubular conduit (4).

* * * * *